(12) United States Patent
Chaudhry et al.

(10) Patent No.: US 6,310,569 B1
(45) Date of Patent: Oct. 30, 2001

(54) SKEWLESS DIFFERENTIAL SWITCHING SCHEME FOR CURRENT-MODE DIGITAL-TO-ANALOG CONVERTERS

(75) Inventors: Irfan A. Chaudhry, Plano; Abdellatif Bellaouar, Dallas; Mounir Fares, Richardson; Eric G. Soenen, Plano, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/774,443

(22) Filed: Jan. 31, 2001

Related U.S. Application Data
(60) Provisional application No. 60/184,995, filed on Feb. 25, 2000.

(51) Int. Cl.$^7$ ................................................. H03M 1/80
(52) U.S. Cl. ...................... 341/144; 341/148; 341/150; 341/152; 341/131; 341/136
(58) Field of Search ..................... 341/144, 155, 341/153, 119, 145, 136, 91, 133

(56) References Cited

U.S. PATENT DOCUMENTS

| | | |
|---|---|---|
| 5,450,084 | 9/1995 | Mercer . |
| 5,612,697 * | 3/1997 | Mercer ................................. 341/153 |
| 5,689,257 | 11/1997 | Mercer et al. . |
| 6,031,477 * | 2/2000 | Mercer ................................. 341/144 |
| 6,100,830 * | 8/2000 | Dedic ................................... 341/136 |

OTHER PUBLICATIONS

Douglas Mercer, "A 16–b D/A Converter with Increased Spurious Free Dynamic Range" IEEE Journal of Solid–State Circuits, vol. 29, No. 10, pp. 1180–1185, Oct. 1994.

Douglas Mercer et al., "12–b 125 MSPS CMOS D/A Designed for Spectral Performance" pp. 243–246, 1996.

\* cited by examiner

*Primary Examiner*—Michael Tokar
*Assistant Examiner*—Lam T. Mai
(74) *Attorney, Agent, or Firm*—Alan K. Stewart; Wade James Brady, III; Frederick J. Telecky, Jr.

(57) ABSTRACT

A skewless differential switching circuit uses skewless switching elements to convert complementary signals with skew into complementary output signals with minimal time skew between the output signals and with equalized rise and fall times of the output signals for minimum harmonic distortion.

8 Claims, 2 Drawing Sheets

SKEWLESS DIFFERENTIAL SWITCHING SCHEME FOR CURRENT-MODE DIGITAL-TO-ANALOG CONVERTERS

This application claims priority under 35 USC §119(e)(1) of provisional application No. 60/184,995, filed Feb. 25, 2000.

FIELD OF THE INVENTION

This invention generally relates to electronic systems and in particular it relates to differential switching schemes for current-mode digital-to-analog converters (DACs).

BACKGROUND OF THE INVENTION

Digital-to-analog converters mainly designed for video applications have a very poor spectral purity when used in communication applications such as the transmit portion of wired and/or wireless digital communication systems. Delay differences between when a bit turns on and when it turns off results in a shift from the ideal fifty percent duty cycle (square wave) and leads to even-order harmonics in the output spectrum. For a given delay difference or skew in time (when a bit turns off or on), the higher the output frequency, the more pronounced the distortion. A typical prior art CMOS current-mode DAC switching scheme, shown in FIG. 1A, includes transistors 20 and 22; current source 24; input nodes Q and QB; and output nodes 26 and 28. In the circuit of FIG. 1, the time skew between Q and QB is of major concern for communication applications. The switches (transistors) 20 and 22 are like a differential pair. The prior art circuit of FIG. 1 uses PMOS transistors, but the same problems with time skew also exist when NMOS switches and current sources are used.

Individual current sources in current mode digital-to-analog converters (DACs) use differential switches to steer current through either one of the two switches. The above mentioned differential switches are controlled by two digital complementary control signals, Q and QB, where, if Q=VDD (power of the highest potential), then QB=VSS (ground or the lowest potential) and vice-versa. Due to the physics of the inverting circuit, there is always some time delay or skew between the original signal and its inverted counterpart. Normally, QB is derived by inverting Q, as shown in FIG. 1B, and thus, there is always some skew present between Q and QB. When current mode DACs are used in frequency domain applications, such as communications systems, the skew between, Q and QB introduces both harmonic and non-harmonic related distortion in the spectrum of the output signal. Hence, the spurious-free dynamic range (SFDR) of the DAC is greatly reduced.

Some attempts have been made in the prior art to improve the time skew problems described above. One example is U.S. Pat. No. 5,689,257 "Skewless Differential Switch and DAC Employing the Same", Nov. 18, 1997. In this patent, two cross-coupled inverters 29 and 30, as shown in FIG. 1C, are used to minimize the skew. However, this technique is limited by mismatches between the two inverters.

SUMMARY OF THE INVENTION

Generally, and in one form of the invention, the differential switching circuit includes: a first inverter; a first pull-up transistor coupled between the first inverter and a high-side power supply node; a first pull-down transistor coupled between the first inverter and a low-side power supply node; an output node of the first inverter coupled to a control node of the first pull-up transistor and a control node of the first pull-down transistor; a second inverter; a second pull-up transistor coupled between the second inverter and the high-side power supply node; a second pull-down transistor coupled between the second inverter and the low-side power supply node; and an output node of the second inverter coupled to a control node of the second pull-up transistor and a control node of the second pull-down transistor, wherein the first and second inverters are coupled together between the inverters and the pull-up transistors, and between the inverters and the pull-down transistors.

DETAILED DESCRIPTION OF PREFERRED EMBODIMENTS

Figure 2:
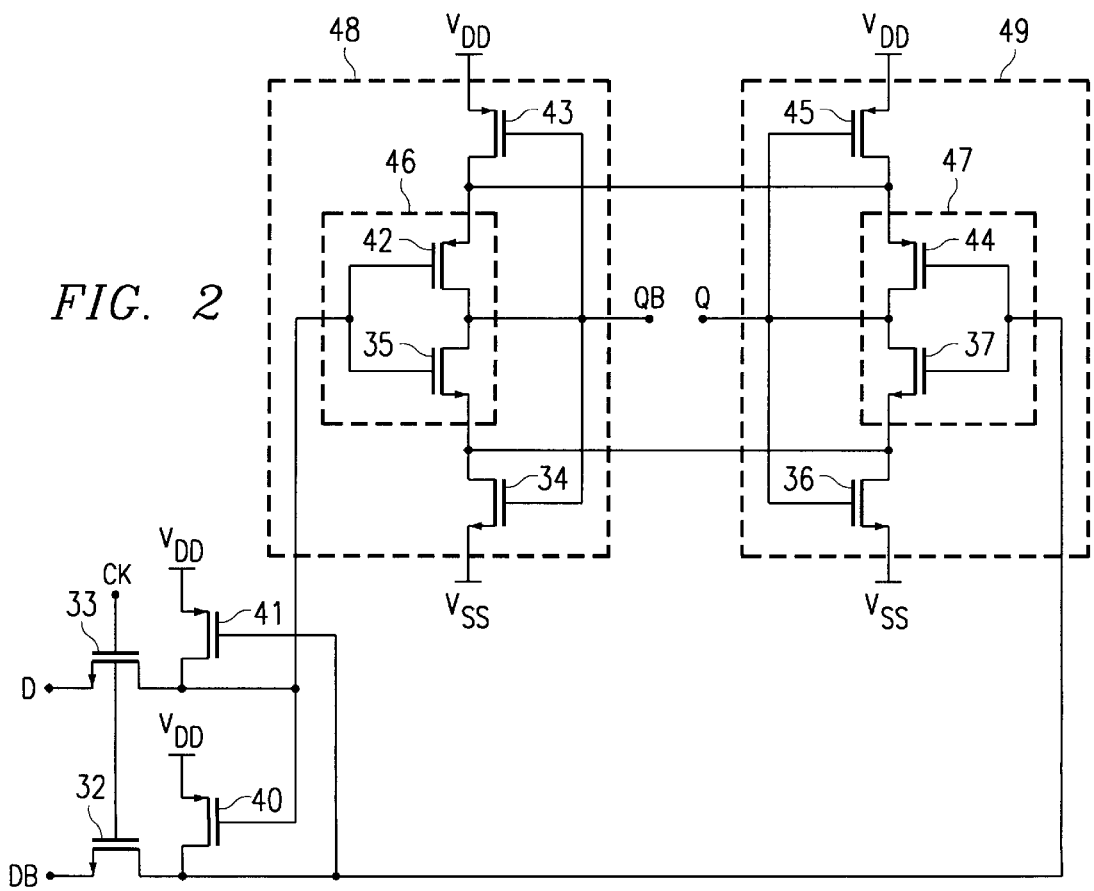
FIG. 2 is a schematic circuit diagram of a preferred embodiment skewless differential switching circuit.

A preferred embodiment skewless differential switching circuit is shown in FIG. 2. The circuit of FIG. 2 includes NMOS transistors 32–37; PMOS transistors 40–45; digital input data D and DB; switch control data Q and QB; clock signal CK; and source voltages $V_{DD}$ and $V_{SS}$. Transistors 35 and 42 form inverter 46. Transistors 37 and 44 form inverter 47. Inverter 46 and transistors 34 and 43 form skewless switching element 48. Inverter 47 and transistors 36 and 45 form skewless switching element 49. Transistors 40 and 41 serve as digital data storage elements. This circuit provides a switching scheme that minimizes the time skew between Q and QB. This switching scheme not only gives a minimum possible time-skew, but, also, gives the same rise and fall times. Equal rise and fall times is very essential when a DAC is reconstructing a sine wave. For minimum harmonic distortion, both half-cycles of the sinusoidal waveform need to have the same rise and fall characteristics.

In the circuit of FIG. 2, D and DB are the complementary signals with skew, while Q and QB are their respective final skewless outputs. By using this skewless differential switching scheme, both control signals by design are forced to wait for each other before moving on to control one of the two switches. In the circuit of FIG. 2, the path of Q to its final level is controlled by QB, while at the same time, Q controls the path of QB to its final voltage level. With the circuit of FIG. 2, the only way for D to reach the switch is if and only if QB allows Q to do so, and the only way for DB to reach the other switch is if and only if Q allows QB to do so. Because Q and QB control each other, the final values of Q and QB, by design, can only be reached simultaneously, leaving no skew between Q and QB. As a result of this, the two complementary signals, Q and QB, are applied simultaneously (without any skew) to the differential switches.

The circuit of FIG. 2 operates as follows. The digital data D and DB is allowed to settle and take its final value before clock signal CK goes high and turns on the pass transistors (switches) 32 and 33. As NMOS transistors 32 and 33 pass bad ONES (voltage levels not high enough to be detected as a ONE), pull up transistors (switches) 40 and 41 are used to restore the voltage level to $V_{DD}$. As D and DB are complementary of each other, a bad ONE is corrected by the complementary ZERO by turning on one of the pull-up PMOS transistors 40 or 41 on the side where the bad ONE appears. For example, let D=1 and DB=0, transistor 33 passes a bad ONE and transistor 32 passes a good ZERO. Then the good ZERO passed by transistor 32 turns on transistor 41 and restores the bad ONE to $V_{DD}$.

In order to describe the operation of the rest of the circuit of FIG. 2, assume D=1, DB=0, Q=1, and QB=0. A restored D=1 turns on transistor 35 and turns off transistor 42. Similarly, DB=0 turns off transistor 37 and turns on transistor 44. With Q=0, transistor 36 is on and transistor 45 is off. With QB=0, transistor 34 is off and transistor 43 is on. This assures that, for Q=1, QB=0, D=1, and DB=0, Q is at voltage level $V_{DD}$ because transistors 44 and 43 are on, and QB is at voltage level $V_{SS}$ because transistors 35 and 36 are on. Therefore, for the outputs Q and QB to change, they not only depend on D and DB, respectively, as expected, but also on DB and D, respectively. Q will not change its state to reflect the state of D until DB allows Q to do so. Similarly, QB will not change its state to reflect DB until D allows QB to do so. As a result of D controlling QB and DB controlling Q, the skew is minimized.

When the state of D changes to ZERO from ONE and DB changes to ONE from ZERO, the circuit of FIG. 2 operates as follows. For D=0, transistor 35 is off and transistor 42 is on. QB starts moving to a higher voltage. This couples QB to the drain of transistor 45 and to the source of transistor 44. Similarly, for DB=1, transistor 37 is on and transistor 44 is off. Q starts moving to a lower voltage. This couples Q to the drain of transistor 34 and to the source of transistor 35. With QB going high, transistor 43 turns off and transistor 34 turns on. With Q going low, transistor 45 turns on and transistor 36 turns off. Then Q goes to ZERO because transistor 37 is turned on by DB and transistor 34 is turned on by QB. Similarly, QB goes to ONE because transistor 42 is turned on by D and transistor 45 is turned on by Q. Because the final output is controlled by the complementary input, the circuit of FIG. 2 minimizes skew and provides an improved differential switch driver for a DAC current source as shown in FIG. 1.

Figure 1A:
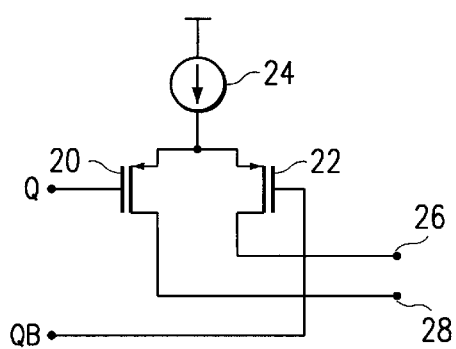
FIG. 1A is a schematic circuit diagram of a prior art CMOS current mode DAC switching scheme.
Figure 1B:
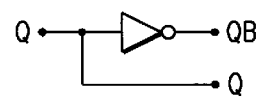
FIG. 1B is a schematic circuit diagram of a first prior art circuit for generating complementary signals.
Figure 1C:
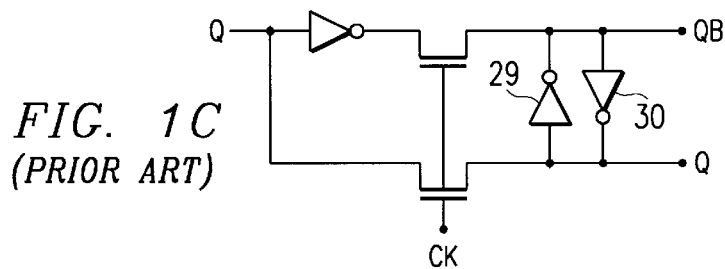
FIG. 1C is a schematic circuit diagram of a second prior art circuit for generating complementary signals.
Figure 3:
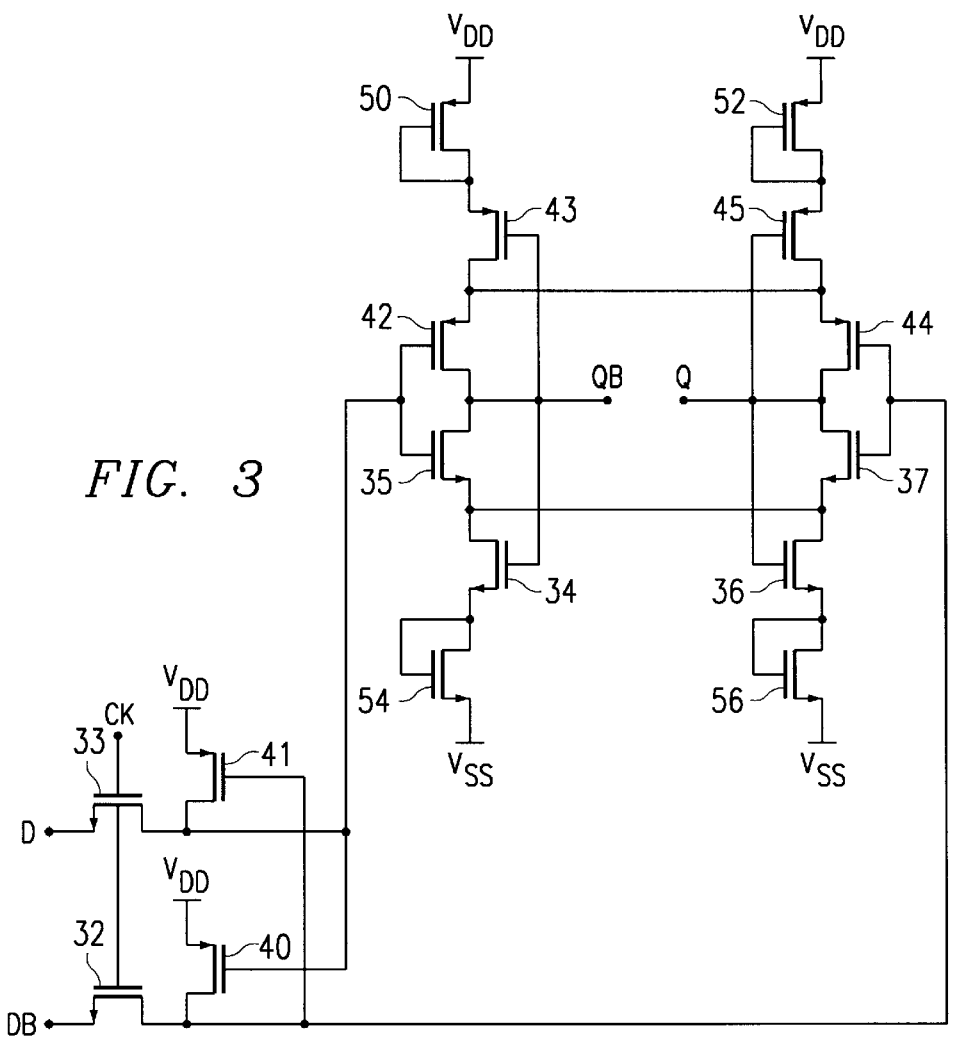
FIG. 3 is a schematic circuit diagram of a preferred embodiment skewless differential switching circuit with built-in swing-limit.

Because transistors 20 and 21, shown in FIG. 1, form a differential pair, Q and QB do not need to swing to $V_{DD}$ and $V_{SS}$. In order to achieve swing-limit from the differential switching scheme of FIG. 2, a diode-connected PMOS transistor 50 is added between $V_{DD}$ and transistor 43, and a diode-connected PMOS transistor 52 is added between $V_{DD}$ and transistor 45, as shown in the circuit of FIG. 3. Also, a diode-connected NMOS transistor 54 is added between $V_{SS}$ and transistor 34, and a diode connected NMOS transistor 56 is added between $V_{SS}$ and transistor 36, as shown in FIG. 3.

Figure 4:
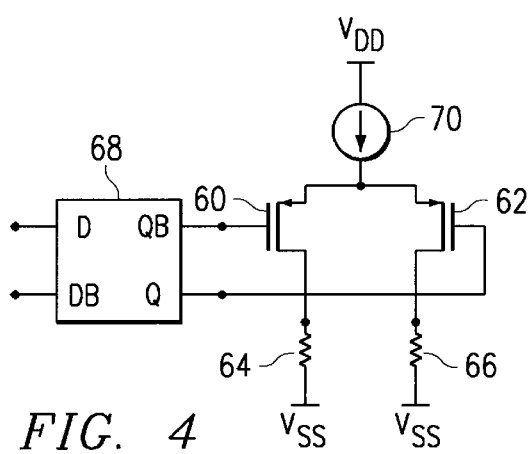
FIG. 4 is a schematic circuit diagram of a skewless PMOS current mode DAC switching scheme.
Figure 5:
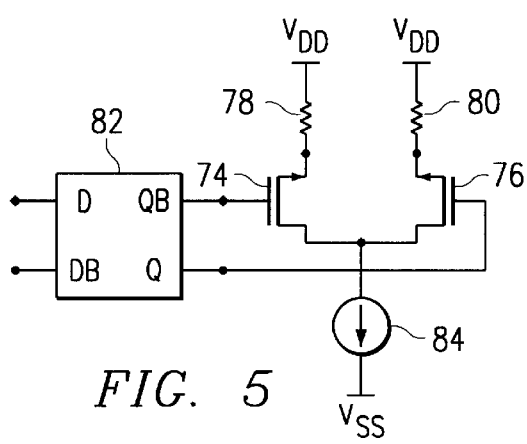
FIG. 5 is a schematic circuit diagram of a skewless NMOS current mode DAC switching scheme.

The skewless differential DAC switch driver is used as shown in FIGS. 4 and 5. The circuit of FIG. 4 includes PMOS transistors 60 and 62; DAC load resistances 64 and 66; switch driver 68; and current source 70. The circuit of FIG. 5 includes NMOS transistors 74 and 76; DAC load resistances 78 and 80; switch driver 82; and current source 84. The circuit of FIG. 4 uses PMOS transistors and the circuit of FIG. 5 uses NMOS transistors. D and DB are provided by DAC logic circuitry and are assumed to have settled to their final state.

The preferred embodiment provides several advantages. Skew reduction is guaranteed by design because Q waits for QB to become valid, while at the same time, QB waits for Q to become valid before allowing either one of them to go to the differential switch. This circuit works well for a wide supply range such as 2.7 to. 5.0 volts. Unlike the prior art solution of U.S. Pat. No. 5,689,257, there is no reduction in performance from the additional skew introduced between D and DB by NMOS pass transistors 32 and 33 as they pass a good ZERO, but a bad ONE. If needed, instead of using the simple pull-up PMOS transistors 40 and 41, a variety of different types of storage elements, such as cross-coupled inverters, can be used. The preferred embodiment is not limited by the mismatches between the two identical cross-coupled inverters used for minimizing the skew in U.S. Pat. No. 5,689,257.

While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description. It is therefore intended that the appended claims encompass any such modifications or embodiments.

What is claimed is:

1. A differential switching circuit comprising:
   a first inverter;
   a first high-side transistor coupled between the first inverter and a high-side power supply node;
   a first low-side transistor coupled between the first inverter and a low-side power supply node;
   an output node of the first inverter coupled to a control node of the first high-side transistor and a control node of the first low-side transistor;
   a second inverter;
   a second high-side transistor coupled between the second inverter and the high-side power supply node;
   a second low-side transistor coupled between the second inverter and the low-side power supply node;
   an output node of the second inverter coupled to a control node of the second high-side transistor and a control node of the second low-side transistor, wherein the first and second inverters are coupled together between the inverters and the high-side transistors, and between the inverters and the low-side transistors; and
   a first transfer switch coupled to an input of the first inverter; and
   a second transfer switch coupled to an input of the second inverter.

2. The circuit of claim 1 further comprising:
   a first storage element coupled to the input of the first inverter; and
   a second storage element coupled to the input of the second inverter.

3. The circuit of claim 2 wherein the first storage element is a first transistor coupled between the input of the first inverter and the high side power supply node; and the second storage element is a second transistor coupled between the input of the second inverter and the high side power supply node.

4. The circuit of claim 3 wherein a control node of the first transistor is coupled to the input of the second inverter; and a control node of the second transistor is coupled to the input of the first inverter.

5. The circuit of claim 1 wherein the first and second transfer switches are transistors.

6. The circuit of claim 1 wherein the first and second transfer switches are NMOS transistors.

7. The circuit of claim 1 further comprising a current mode digital-to-analog converter switching circuit coupled to the output node of the first inverter and the output node of the second inverter.

8. The circuit of claim 7 wherein the converter switching circuit comprises:

a current source;

a first transistor coupled to the current source, a control node of the first transistor coupled to the output of the first inverter; and a second transistor coupled to the current source, a control node of the second transistor coupled to the output of the second inverter.

* * * * *